United States Patent [19]

Okinoshima et al.

[11] Patent Number: 5,292,619
[45] Date of Patent: Mar. 8, 1994

[54] PHOTOSENSITIVE POLYMER COMPOSITION

[75] Inventors: Hiroshige Okinoshima, Annaka; Hideto Kato, Takasaki, both of Japan

[73] Assignee: Shin-Etsu Chemical Co., Ltd., Tokyo, Japan

[21] Appl. No.: 853,683

[22] Filed: Mar. 17, 1992

[30] Foreign Application Priority Data

Mar. 18, 1991 [JP] Japan .................. 3-078587

[51] Int. Cl.$^5$ ............................. G03C 1/725
[52] U.S. Cl. ...................... 430/283; 430/281; 522/137; 522/142; 522/162
[58] Field of Search ............. 430/283, 281; 522/137, 522/142, 162

[56] References Cited

U.S. PATENT DOCUMENTS 4,650,849  3/1987  Nishimura et al. .................. 528/26
5,019,482  5/1991  Ai et al. ........................... 430/283

FOREIGN PATENT DOCUMENTS 337698   4/1989  European Pat. Off. .
1522441  9/1966  Fed. Rep. of Germany .

OTHER PUBLICATIONS

Patent Abstracts of Japan, vol. 13, No. 345, p. 909.

*Primary Examiner*—Marion E. McCamish
*Assistant Examiner*—Mark A. Chapman
*Attorney, Agent, or Firm*—Millen, White, Zelano, & Branigan

[57] ABSTRACT

A photosensitive polymer composition comprising, in admixture, a polymer predominantly comprising a recurring unit of the formula (I):

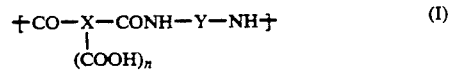

wherein x is a tri- or tetravalent organic group, Y is a divalent organic group, and n is equal to 1 or 2 and a compound having a urea bond of the formula (II):

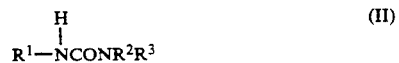

wherein $R^1$ is a group having a functional group capable of forming a dimer or polymer upon exposure to radiation, $R^2$ and $R^3$ are independently a hydrogen atom or a monovalent organic group is shelf stable and applicable as relatively thick coatings having sufficient photosensitivity to form semiconductor element surface protective films.

13 Claims, No Drawings

PHOTOSENSITIVE POLYMER COMPOSITION

This invention relates to a photosensitive polymer composition for forming polyamide resin coatings useful as semiconductor element surface protective films, semiconductor element insulating films, liquid crystal element orienting films, multi-layer printed circuit board insulating films and the like.

BACKGROUND OF THE INVENTION

In the recent years, polyimide resin materials are used as protective films on semiconductor elements such as transistors, IC'S and LSI's as well as interlayer insulating films between multi-layer wirings. The polyimide resin materials utilized for such purposes are subject to fine working steps of forming through holes or the like as always required in the manufacture of semiconductor elements. For the purpose of completing the fine working process more effective, attempts were made to develop polyimide resin materials which could also be used as photosensitive heat-resistant material.

There were proposed several materials including
(1) a composition comprising a polyamic acid and a bichromate (JP-B No. 17374/1974),
(2) a composition comprising a compound obtained by introducing a photosensitive group into the carboxyl group of a polyamic acid through ester linkage (JP-B 30207/1980),
(3) a composition comprising a compound obtained by reacting a polyamic acid with an epoxy-containing compound having a photosensitive group (JP-A 45746/1980), and
(4) a composition comprising a polyamic acid and an amine compound having a photosensitive group (JP-B 145794/1979). It is to be noted that Japanese Patent Publication is abbreviated as JP-B and Japanese Patent Application Kokai as JP-A.

Composition (1) has a very short pot life and forms Polyimide films having chromium ion left therein. Composition (2) forms polyimide films having chloride ion left therein because a dehydrochlorination reaction is used to introduce a photosensitive group. Therefore films of both compositions (1) and (2) suffered from a purity problem. In composition (3), a photosensitive group can be introduced into the base compound through ester linkage without contaminating it with an ionic impurity, but at a very low rate of introduction which leads to low sensitivity in practical applications. Composition (4) is advantageous in that no ionic impurities are introduced and a sufficient amount of photosensitive group can be introduced, but has some disadvantages. In a prebaking step of volatilizing the solvent from a photosensitive Polymeric solution before exposure, the photosensitive component can be partially volatilized off. A problem also arises in forming thick films. As the solvent volatilizes off in the prebaking step, the photosensitive component becomes a poor solvent for the polyamic acid, causing the resulting films to be whitened leading to difficulty in subsequent steps.

SUMMARY OF THE INVENTION

An object of the present invention is to overcome the above-mentioned problems of the prior art and to provide a novel and improved photosensitive Polymer composition which is substantially free of an ionic impurity and stable on shelf storage and forms heat-curable, relatively thick poyimide resin films of quality having a high and stable degree of photosensitivity.

The inventors have found that by blending a polymer predominantily comprising a recurring unit of the general formula (I) with a compound of the general formula (II), there is obtained a photosensitive polymer composition which is fully stable on shelf storage, has improved photosensitivity, sensitivity stability and thick film forming abilitys and is curable to polyimide resin films of quality suitable as semiconductor element surface protective films or the like.

Formula (I):

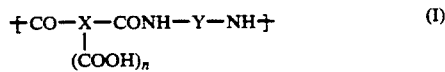

In the formula, X is a tri- or tetravalent organic group, y is a divalent organic group, and n is equal to 1 or 2.

Formula (II):

In the formula, $R^1$ is a group having a functional group capable of forming a dimer or polymer upon exposure to radiation, $R^2$ and $R^3$ are independently a hydrogen atom or a monovalent organic group.

By using a compound having a urea bond of formula (II) as a photosensitive component and blending a polyimide precursor of formula (I) with the compound of formula (II), a photosensitive group can be introduced without developing or introducing an ionic impurity. Since the compound of formula (II) does not evaporate off during preheating of the composition applied to substrates, films are obtained without whitening so that the films may remain sensitive, that is, be subject to exposure. In addition, the photo-sensitive polymer composition experiences a minimal viscosity variation during a long term of storage. The composition also has acceptable photosensitivity, pattern retention after heat treatment, and thick film forming ability, and cures to coatings having improved heat resistance, electrical and mechanical properties.

Therefore, the present invention provides a photosensitive polymer composition comprising in admixture, a polymer predominantly comprising a recurring unit of formula (I) with a compound having a urea bond of formula (II).

DETAILED DESCRIPTION OF THE INVENTION

The first essential component of the photosensitive polymer composition of the present invention is a polyimide precursor having a recurring unit of the following general formula (I):

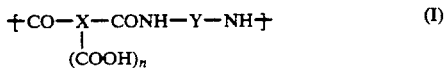

wherein x is a tri- or tetravalent organic group, Y is a divalent organic group, and n is equal to 1 or 2.

In formula (I), X is an acid anhydride residue, and thus derived from, for example, trimellitic anydride where x is pyromellitic dianhydride where x is

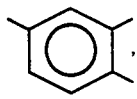

benzophenonetetracarboxylic dianhydride where x is

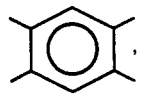

3,3',4,4'-biphenyltetracarboxylic dianhydride where x is

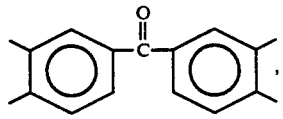

2,2-bis(3,4'-benzenedicarboxylic anhydride)-perfluoropropane where X is

bis(3,4'-dicarboxyphenyl)dimethylsilane dianhydride where X is

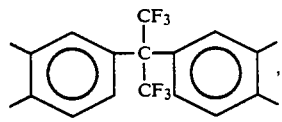

and 1,3-bis(3,4-dicarboxyphenyl-1,1,3,3,-tetramethyl disiloxane dianhydride where X is

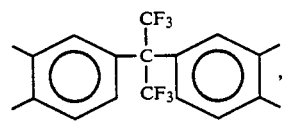

It will be understood that X may be any one of the above-mentioned acid anhydride residues or a mixture of two or more.

Y is a divalent organic group which is derived from a diamine H₂N—y—NH₂. Y may be a divalent organic group containing an aromatic ring, siloxane linkage, silethylene linkage or silphenylene linkage. Illustrative, non-limiting examples of the diamine include aromatic ring-containing diamines having 6 to 20 carbon atoms, for example, p-phenylene -diamine, m-phenylenediamine, 4,4'-diaminodiphenylmethane, 4,4'-diaminodiphenyl ether, 2,2,-bis(4-aminophenyl) propane, 4,4'-diaminodiphenyl sulfone, 4,4'sulfide,, 1,4-bis(3-aminophenoxy)benzene, 1,4-bis(4-aminophenoxy)benzene, 1,4-bis(m-aminophenylsulfonyl)benzene, 1,4-bis(p-aminophenylsulfonyl)benzene, 1,4-bis(m-aminophenylthioether)benzene, 1,4-bis(p-aminophenylthioether)benzene, 2,2-bis[4-(4-amino phenoxy)phenyl]propane, 2,2-bis[3-methyl-4-(4-aminophenoxy)phenyl]propane, 2,2-bis[3-chloro-4-(4-amino-phenoxy) phenyl ]propane, 1, 1-bis[4-(4-aminophenoxy)phenyl]ethane, 1, 1-bis[3-methyl-4-(4-aminophenoxy) phenyl]ethane, 1,1-bis[3-chloro-4-(4-aminophenoxy)phenyl]ethane, 1,1-bis[3,5-dimethyl-4 -(4-aminophenoxy)-phenyl]ethane, bis[4-(4-aminophenoxy) phenyl ]methane, bis[3-methyl-4-(4-aminophenoxy) pheny ]methane, bis[3-chloro-4-(4-aminophenoxy) phenyl]methane, bis [3,5-dimethyl-4-(4-amino phenoxy)phenyl]methane, bis[4-(4-amino phenoxy)phenyl]sulfone, 2,2-bis[4-(4-aminophenoxy)phenyl] perfluoropropane, etc., and diamines and polyamines having an amino or amide group as a nuclearly substituting group and silicon diamines as shown below.

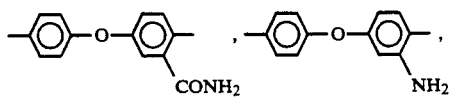

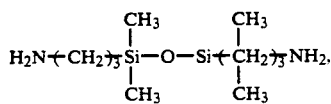

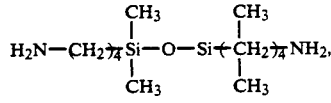

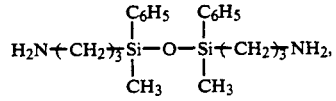

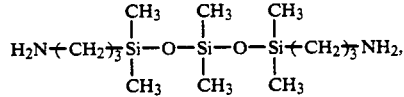

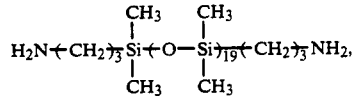

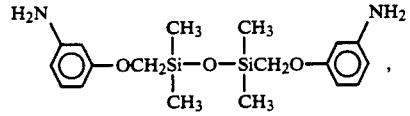

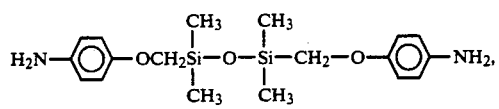

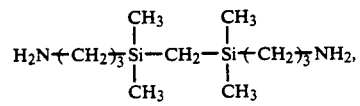

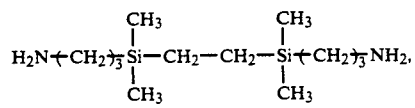

-continued

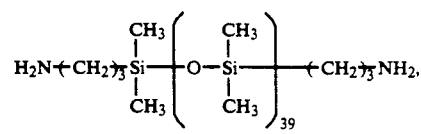

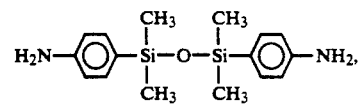

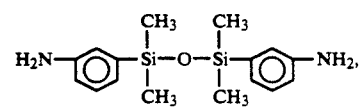

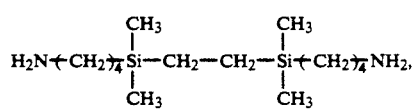

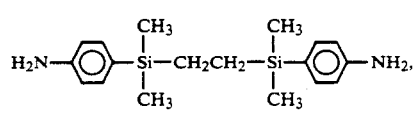

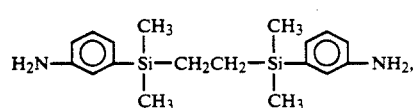

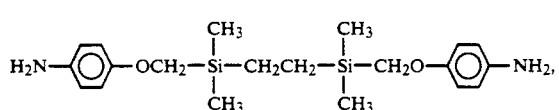

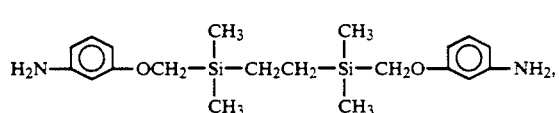

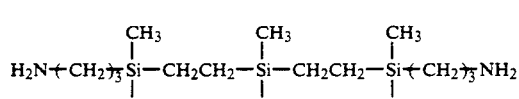

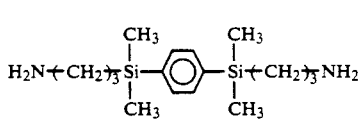

It will be understood that Y may be any one of the above-mentioned diamine residues or a mixture of two or more.

The second essential component of the composition is a compound having a urea bond of the following general formula (II):

$$R^1-\overset{H}{\underset{|}{N}}CONR^2R^3 \quad (II)$$

In formula (II), $R^1$ is a group having a functional group capable of forming a dimer or polymer upon exposure to radiation. Examples of the group represented by $R^1$ are given below.

$$CH_2=CH-, \quad CH_2=CH-CH_2-,$$

-continued

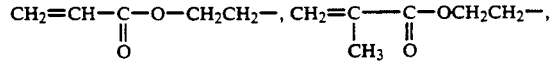

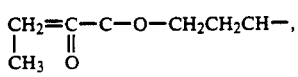

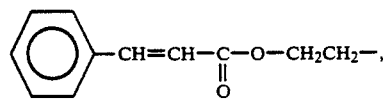

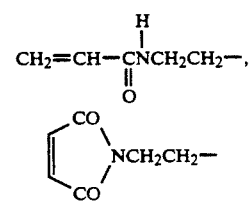

In formula (II), $R^2$ and $R^3$ are independently a hydrogen atom or a monovalent organic group which may contain a functional group capable of forming a dimer or polymer. Examples of the group represented by $R^2$ and $R^3$ include H, $-CH_3$, $CH_2CH_3$,

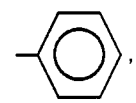

and groups as previously exemplified for $R^1$.

Illustrative, non-limiting examples of the compound of formula (II) are given below.

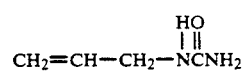

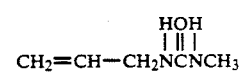

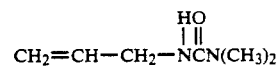

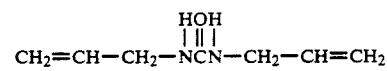

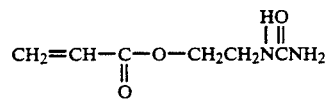

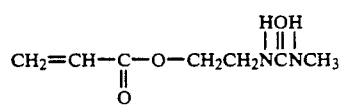

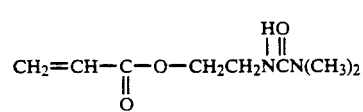

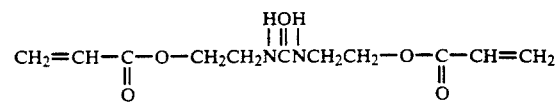

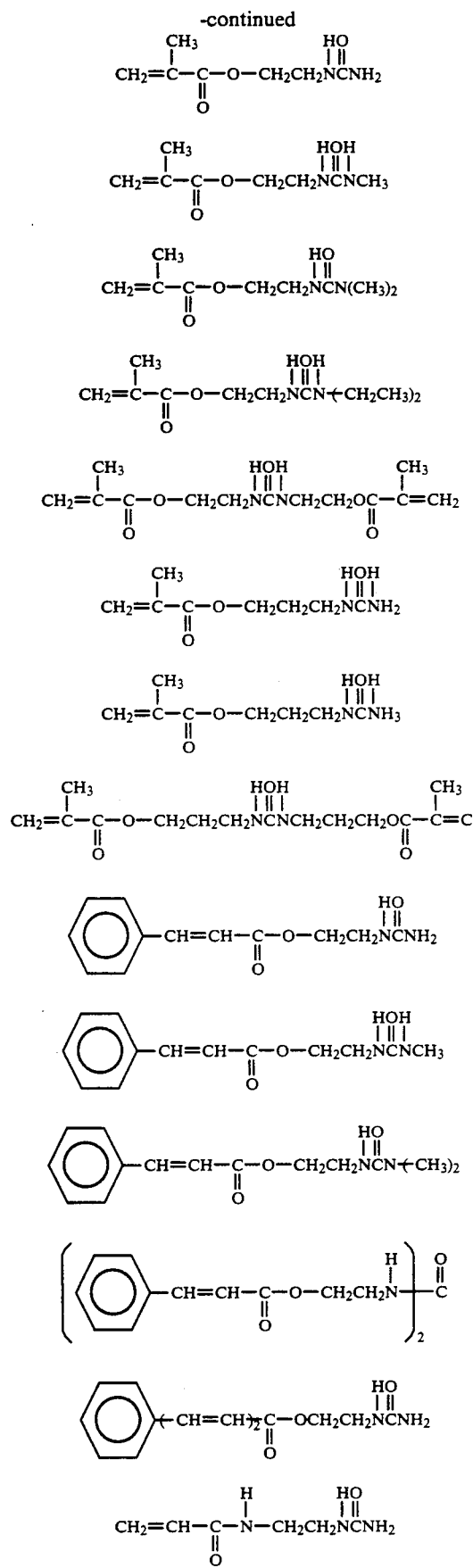

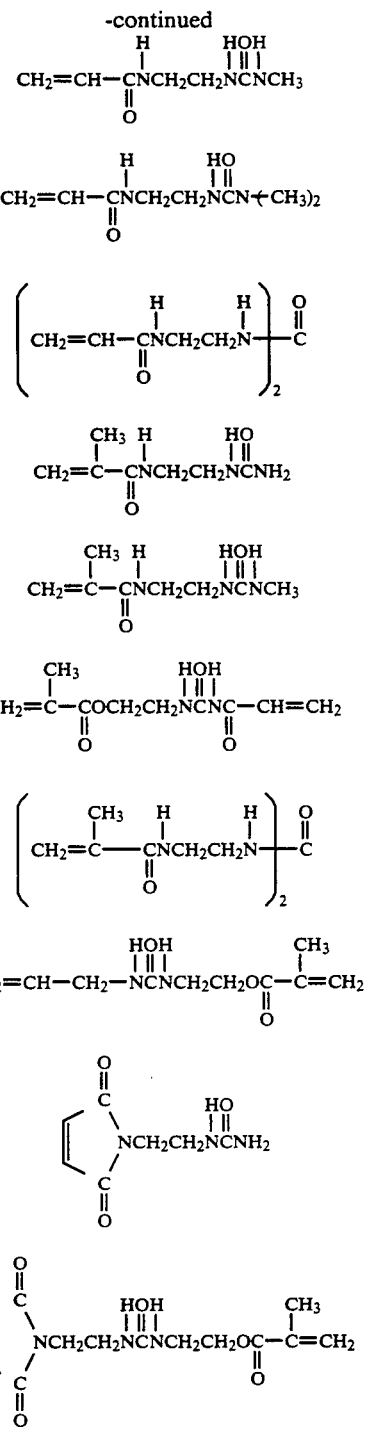

These compounds may be used alone or in admixture of two or more.

The compound of formula (II) may be blended in any desired amount, preferably of about 0.2 to 1.5 molar equivalents, more preferably about 0.4 to 1.2 molar equivalents relative to the carboxyl group (—COOH group) in the polymer of formula (I). Compositions containing less than 0.2 molar equivalents of compound (II) on this basis would have low photosensitivity whereas more than 1.5 molar equivalents of compound (II) is sometimes undesirable because of a substantial film thickness reduction during final heat treatment.

Preferably, the composition of the present invention contains a sensitizer having a photosensitization effect on the photosensitive group of the compound of formula (II) or has a polymerization initiator capable of initiating polymerization of the compound of formula (II). Examples of the sensitizer and initiator include benzoin, 2-methylbenzoin, benzoin methyl ether, benzoin ethyl ether, benzoin isopropyl ether, benzoin butyl ether, 2-1-butylanthraquinone, 1,2-benzo-9,10-anthraquinone, anthraquinone, methylanthraquinone, 4,4'-bis(diethyl-amino)benzophenone, acetophenone, benzophenone, thioxanthone, 1,5-acenaphthene, 2,2-dimethoxy-2-phenylacetophenone, 1-hydroxycyclohexyl phenyl ketone, 2-methyl-[4 (methylthio)-phenyl]-2-morpholino-1-propanone, 2-benzyl-2-dimethylamino-1-(4-morpholinophenyl)-butanone, diacetyl, benzyl, benzyldimethylketal, benzyldiethylketal, diphenyldisulfide, anthracene, 2-nitrofluorene, dibenzalacetone, 1-nitropyrene, 1,8-dinitro pyrene, 1,2-naphthoquinone, 1,4-naphthoquinone, 1,2-benzanthraquinone, Michler's ketone, 4,4'-bis(diethylamino)benzophenone, 2,5-bis(4'-diethylaminobenzal)cyclopentanone, 2, 6-(4'-diethylaminobenzal)-4-methylcyclohexanone, 4,4'-bis(dimethylamino)chalcone, 4,4'-bis(diethylamino)chalcone, 4-dimethylaminocinnamylidenein-danone, 4-dimethylaminopendylideneindanone, 2-(4'-dimethylaminophenylvinylene) -benzothiazole, 2-(4'-dimethylaminophenylvinylene) -isonaphtho-thiazole, 1,3-bis(4'-dimethylaminobenzal)acetone, 1,3-bis(41'-diethylaminobenzal)acetone, 3,3'-carbonyl-bis(7-diethylaminocoumarin) 7-diethylamino-3-benzoylcoumarine, 7-diethylamino-4-methylcoumarine, N-phenyl-diethanol amine, N-p-tolyldiethylamine, 2,6-di(p-azidobenzal)- 4-methylcyclohexanone, 2,6-di(p-azidobenzal)cyclohexanone, 4,4'-diazidochalcone, 4,4'-diazidobenzalacetone, 4,4'-diazisostilbene, 4,4'-diazidobenzophenone, 4,4'-diazidodiphenylmethane, 4,4'-diazidophenyl amine, etc. These sensitizers and initiators may be used alone or in admixture of two or more.

The sensitizers or initiators are preferably blended in an amount of about 0.01 to 20% by weight, more preferably about 0.05 to 15% by weight based on the total weight of the polymer of formula (I) and the compound of formula II). Less than 0.01% by weight is insufficient to provide photosensitivity whereas more than 20% by weight would rather lower photosensitivity.

For improving photosensitivity, the composition of the present invention may further contain a compound capable of photo forming a dimer or polymer as a comonomer. Examples of the photopolymerizable or photodimerizable compound include 2-ethylhexylacrylate, 2-hydroxyethylacrylate, N-vinyl-2-pyrrolidone, 2-dimethylaminoethylmethacrylate, 2-diethylaminoethylmethacrylate, N-methyl bis(methacryloxyethyl)amine, carbitol acrylate, tetrahydrofurfuryl acrylate, isobornyl acrylate, 1,6-hexanediol diacrylate, neopentyl glycol diacrylate, ethylene glycol diacrylate, polyethylene glycol diacrylate, pentaerythritol diacrylate, trimethylol propane triacrylatel pentaerythritol triacrylate, dipentaerythritol hexaacrylate, tetramethylolmethane tetraacrylate, tetraethylene glycol diacrylate, nonaethylene glycol diacrylate, methylenebisacrylamide, N-methylolacrylamide, and similar compounds in which acrylate or acrylamide is changed into methacrylate or methacrylamide. Preferred among these are compounds having at least two carbon-to-carbon double bonds such as ethylene glycol diacrylate, trimethylol propane triacrylate, and methylenebisacrylamide.

These comonomers are preferably added in amounts of up to about 10% by weight, more preferably about 1 to 5% by weight based on the total weight of the polymer of formula (I) and the compound of formula (II). More than 10% by weight of comonomer would cause coatings to be whitened after preheating.

If desired, a functional alkoxysilane compound may be added to the photosensitive polymer composition of the present invention. The functional alkoxysilane compound is effective for improving the interfacial adhesion between a heat resistant polymeric coating of the polymer composition and a substrate in the form of silicon which is covered with the coating or an inorganic insulating film thereon. Examples include α-aminopropylmethyltrimethoxysilane, N (aminoethyl)- γ-amino propyldimethoxysilane, γ-glycidoxypropylmethyltriethoxysilane, etc. These functional alkoxysilane compounds are preferably added in amounts of about 0.1 to 5% by weight, more preferably about 0.5 to 3% by weight based on the total weight of the polymer of formula (I) and the compound of formula (II).

For improving the shelf stability of the photosensitive polymer composition in solution form, a polymerization inhibitor is preferably added. Some illustrative, non-limiting examples of the inhibitor include hydroquinone, hydroquinone monomethyl ether, N-nitrosodiphenylamine, p-tert-utylcatechol, phenothiazine, N-phenylnaphthylamine, 2,6-di-tert -butyl-p-methylphenol, etc. The inhibitors are preferably added in amounts of up to about 5% by weight, more preferably up to about 0.5% by weight based on the total weight of the polymer of formula (I) and the compound of formula (II) .

In the practice of the invention, the photosensitive polymer composition is dissolved in a solvent in which the components are soluble, forming a coating solution which is applied to substrates or supports. The substrate may be precoated with an alkoxysilane compound as mentioned above for improving the adhesion of the coating to the substrate. The solvents used herein are often polar solvents, for example, such as dimethylformamide, N-methylpyrrolidone, dimethylacetamide, diglyme, isobutyl acetate, and cyclopentanone. Other solvents such as alcohols, aromatic hydrocarbons, ethers, ketones, and esters may be additionally used in limited amounts as long as none of the components will precipitate.

After the photosensitive polymer composition is dissolved in a solvent, the coating solution is passed through a filter and then applied to substrates. Application may be done by conventional methods, for example, by coating substrates with the coating solution by means of a spin coater bar coater or blade coater, or screen printing, by dipping substrates in the coating solution, and by spraying the coating solution to substrates.

The coatings thus applied are dried by air drying, heat drying, vacuum drying or a combination thereof, and then exposed to light typically through photomasks. Activation light rays are ultraviolet radiation, X-rays, and electron radiation, with UV being preferred. Suitable light sources include low pressure mercury lamps, high pressure mercury lamps, ultrahigh pressure mercury lamps, and halogen lamps, with the ultrahigh pressure mercury lamps being preferred. Light exposure favors a nitrogen atmosphere.

After exposure, unexposed portions are removed by development using a dipping or spraying method. The preferred developer used herein is one capable of completely dissolving away unexposed portions within an appropriate time, typically aprotic polar solvents, for example, N-methylpyrrolidone, N-acetyl-2-pyrrolidone, N,N-dimethyl-formamide, N,N-dimethylacetamide, dimethylsulfoxide, hexamethylphosphoric triamide, N-benzyl-2-pyrrolidone, and γ-butyrolactone, alone or in admixture with a second solvent, for example, alcohols such as ethanol and isopropanol, aromatic hydrocarbons such as toluene and xylene, ketones such as methyl ethyl ketone and methyl isobutyl ketone, esters such as ethyl acetate and methyl propionate, and ethers such as tetrahydrofuran and dioxane. Preferably, development is immediately followed by rinsing with a solvent as exemplified above as the second solvent.

The above-mentioned development leaves a relief pattern of the coating in which the polymer of formula (I) exists in the form of a polyimide precursor. The developed coating is then heat treated, for example, at 200° to 450° C. for 10 minutes to 10 hours, obtaining a patterned and cured polyimide resin coating. The patterned polyimide resin coatings resulting from the photosensitive polymer composition of the present invention have improved heat resistance, electrical and mechanical properties.

BENEFITS

The photosensitive polymer composition of the present invention has advantages including substantially elimination of an ionic impurity, stable shelf storage, stable sensitivity and ability to form thick films. The composition is heat curable into polyimide resin films of quality having improved heat resistance, electrical and mechanical properties. Therefore, when applied to semiconductor elements as coatings thereon, the composition allows for creation of a fine pattern through light exposure. Therefore, the composition will find application as semiconductor element surface protective coatings such as junction coating films, passivation films, buffer coating films, and α-radiation shielding films; semiconductor element insulating films such as interlayer insulating films in multi-layer wiring structures; liquid crystal display element orienting films; and insulating films in multi-layer printed circuit boards.

EXAMPLE

Examples of the present invention are given below by way of illustration and not by way of limitation. In the examples, all parts are by weight.

EXAMPLES 1-8 & COMPARATIVE EXAMPLE

Photosensitive polymer solutions (Examples 1-8) were prepared by furnishing the polymer, photosensitive compound, photosensitizer, and polymerization initiator shown in Tables 1 to 3, blending them in the combination and amount shown in Table 5, and dissolving the blends in 400 parts of N-methyl-2-pyrrolidone.

Another photosensitive polymer solution (Comparative Example) was prepared as above except that the compound shown in Table 4 was used instead of the photosensitive compound and blended in the combination and amount shown in Table 5.

Each of these photosensitive polymer solutions was spin coated on a silicon wafer at 1,500 rpm for 12 seconds and dried at 70° C. for one hour, obtaining a coating of even thickness. The coating was exposed to light in a nitrogen atmosphere for 10 seconds through a mask under a high pressure mercury lamp operating at 2 kw. After exposure, the wafer was dipped in a mixture of N-methyl-2-pyrrolidone and xylene (1/1 by volume) for development, rinsed with xylene, and then dried. The light exposure was evaluated at this point. Thereafter, the wafer was heated at 150 0C. for one hour and then at 350° C. for a further one hour. The heated coating was evaluated.

Exposure is evaluated "Good" when the retention of the coating after development and rinsing is 80% or higher and "Poor" when the same coating retention is less than 80%. Quality of heated coating is evaluated "Good" when it is free of cracking or separation and "Poor" when cracking or separated occurs.

Additionally, for evaluating shelf stability, the photosensitive polymer solutions were allowed to stand for 6 months at 5° C. and measured for viscosity by means of Ostwald's viscometer before and after standing.

The results are shown in Table 5.

TABLE 1

| Symbol | Polymer structure |
|---|---|
| P-1 | [chemical structure diagram showing two repeating units with subscripts 95 and 5] |

TABLE 1-continued

| Symbol | Polymer structure |
|---|---|
| P-2 | 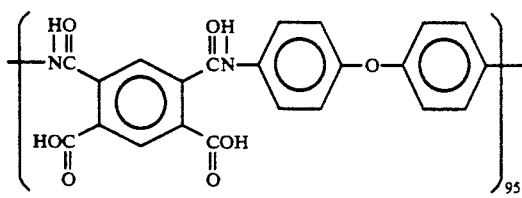 |

TABLE 2

| Symbol | Photosensitive compound structure |
|---|---|
| U-1 | 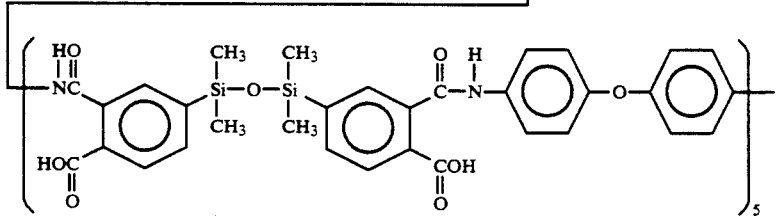 |
| U-2 | 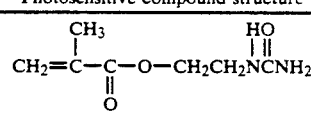 |
| U-3 | 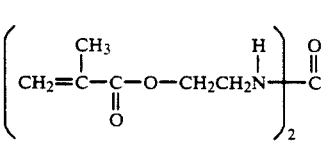 |

| Symbol | Photosensitizer or polymerization initiator |
|---|---|
| S-1 | Michler's ketone |
| S-2 | 2,6-di(p-azidobenzal-4-methylcyclohexanone |
| S-3 | 2-methyl-[4-(methylthio)phenyl]-2-morpholino-1-propanone |
| S-4 | 2-benzyl-2-dimethylamino-1-(4-morpholinophenyl)-butanone |
| S-5 | 2-isopropylthioxanthone |
| S-6 | 3,3'-carbonyl-bis-(7-diethylaminocoumarin) |

TABLE 4

| Symbol | Photosensitive compound structure |
|---|---|
| A-1 | 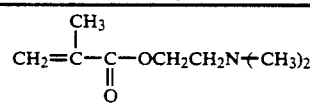 |

TABLE 5

| | | Polymer (I) (pbw) | Photosensitive compound (pbw) | Sensitizer or initiator | Inhibitor (pbw) | Coating thickness (μm) | Photo-sentitivity | Quality of heated coating | Viscosity after 6 months Initial viscosity |
|---|---|---|---|---|---|---|---|---|---|
| Example | 1 | P-1 (100) | U-1 (65) | S-1, S-2 (5) (5) | Hydroquinone monomethyl ether (0.15) | 25 | Good | Good | 3200 cs 3400 |
| | 2 | P-1 (100) | U-1 (65) | S-3, S-5 (8) (2) | Hydroquinone monomethyl ether (0.15) | 25 | Good | Good | 3350 3400 |
| | 3 | P-1 (100) | U-1 (65) | S-4 (8) | Hydroquinone monomethyl ether (0.15) | 25 | Good | Good | 3350 3400 |
| | 4 | P-1 (100) | U-1 (52) | S-4, S-6 (8) (0.5) | Hydroquinone monomethyl ether (0.15) | 22 | Good | Good | 3000 3150 |
| | 5 | P-1 (100) | U-2 (65) | S-4 (8) | Hydroquinone monomethyl ether (0.15) | 23 | Good | Good | 2950 3100 |
| | 6 | P-1 (100) | U-1 U-2 (52) (21) | S-3, S-5 (8) (2) | Hydroquinone monomethyl ether (0.15) | 25 | Good | Good | 3250 3350 |
| | 7 | P-1 (100) | U-3 (85) | S-3, S-5 (8) (2) | Hydroquinone monomethyl ether (0.15) | 25 | Good | Good | 2950 3100 |
| | 8 | P-2 (100) | U-1 (80) | S-3, S-5 (9) (2) | Hydroquinone monomethyl ether (0.15) | 28 | Good | Good | 4450 4800 |
| Comparative Example | | P-1 (100) | A-1 (60) | S-3, S-5 (8) (2) | Hydroquinone monomethyl ether | 21 | Poor | — | 2400 2700 |

TABLE 5-continued

| Polymer (I) (pbw) | Photo-sensitive compound (pbw) | Sensitizer or initiator | Inhibitor (pbw) | Coating thickness (μm) | Photo-sentitivity | Quality of heated coating | Viscosity after 6 months Initial viscosity |
|---|---|---|---|---|---|---|---|
| | | | (0.15) | | | | |

As seen from Table 5. the photosensitive polymer compositions within the scope of the present invention (Examples 1-8) could form relatively thick coatings having acceptable photosensitivity and pattern retention after heat treatment. The compositions in solution form was held stable as demonstrated by a viscosity change within 10% over 6-month shelf storage. The coatings were excellent in heat resistance, electrical and mechanical properties.

Although some preferred embodiments have been described, many modifications and variations may be made thereto in the light of the above teachings. It is therefore to be understood that within the scope of the appended claims, the invention may be practiced otherwise than as specifically described.

We claim:

1. A photosensitive polymer composition comprising, in admixture, a polymer predominantly comprising a recurring unit of the formula (I):

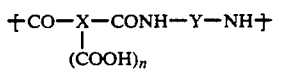

wherein X is a tri- or tetravalent organic group, Y is a divalent organic group, and n is equal to 1 or 2 and a compound having a urea bond of the formula (II):

wherein $R^1$ is a group having a functional group capable of forming a dimer or polymer upon exposure to radiation, and $R^2$ and $R^3$ are independently a hydrogen atom or a monovalent organic group.

2. The composition of claim 1 wherein the compound of formula (II) is blended in an amount of about 0.2 to 1.5 molar equivalents relative to the carboxyl group in the polymer of formula (I).

3. The composition of claim 1 which further comprises a sensitizer or polymerization initiator in an amount of about 0.01 to 20% by weight based on the total weight of the polymer of formula (I) and the compound of formula (II).

4. The composition of claim 1 which further comprises a compound capable of photo forming a dimer or polymer in an amount of up to about 10% by weight based on the total weight of the polymer of formula (I ) and the compound of formula (II).

5. The composition of claim 1 which further comprises an alkoxysilane compound.

6. A photosensitive polymer composition comprising, in admixture, a polymer predominantly comprising a recurring unit of the formula (I):

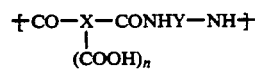

wherein X is selected from the group consisting of

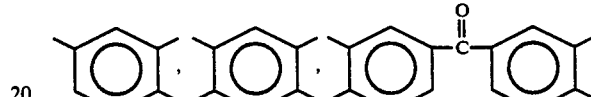

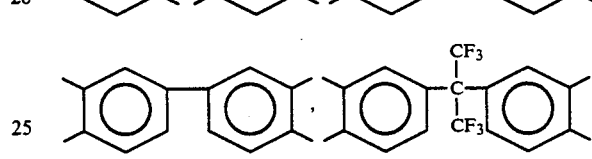

and

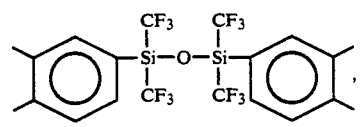

Y is a divalent organic group containing an aromatic ring, siloxane linkage, silethylene linkage or silphenylene linkage, and n is equal to 1 or 2, and a compound having a urea bond of the formula (II):

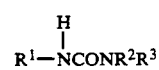

wherein $R^1$ is selected from the group consisting of

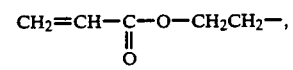

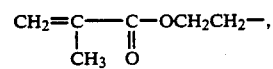

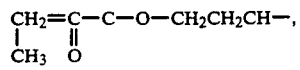

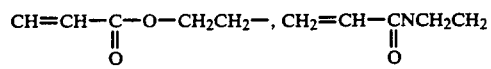

and

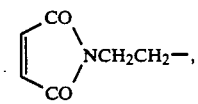

and $R^2$ and $R^3$ are independently a hydrogen atom or a monovalent organic group.

7. The composition of claim 6 wherein the compound of formula (II) is blended in an amount of about 0.2 to 1.5 molar equivalents relative to the carboxyl group in the polymer of formula (I).

8. The composition of claim 6 which further comprises a sensitizer or polymerization initiator in an amount of about 0.01 to 20% by weight based on the total weight of the polymer of formula (I) and the compound of formula (II).

9. The composition of claim 6 which further comprises a compound capable of photo forming a dimer or polymer in an amount of up to about 10% by weight based on the total weight of the polymer of formula (I) and the compound of formula (II).

10. The composition of claim 6 which further comprises an alkoxysilane compound.

11. The composition of claim 6 wherein Y is derived from a diamine compound of the formula H₂N—Y—NH₂.

12. The composition of claim 6 wherein R² and R³ are independently selected from a hydrogen atom, —CH₃, —CH₂CH₃,

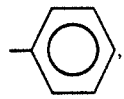

and groups defined for R¹ above.

13. The composition of claim 6 wherein the compound of formula (II) is:

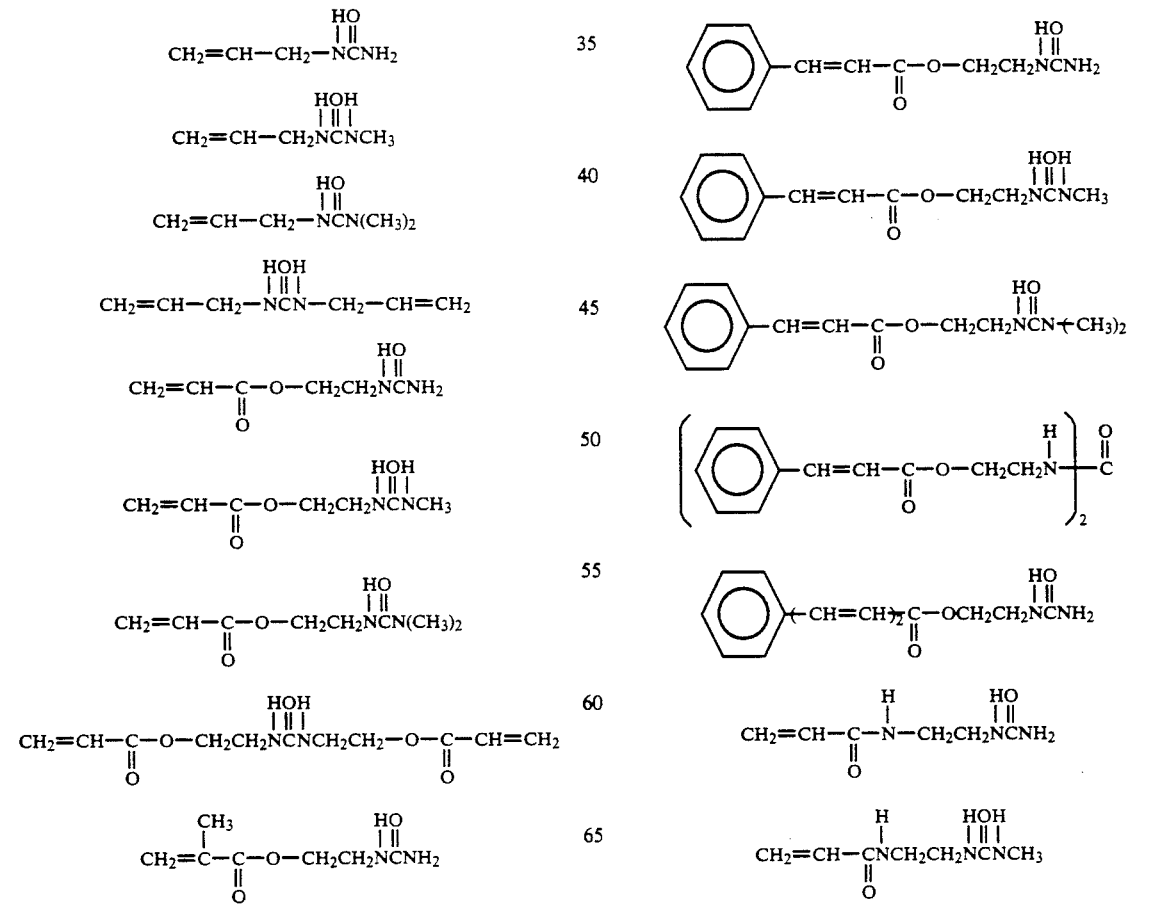

-continued
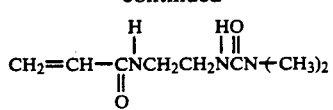
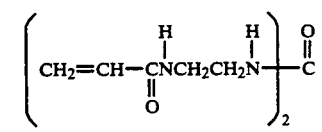
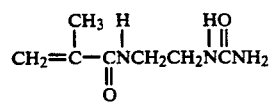
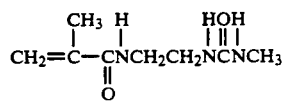
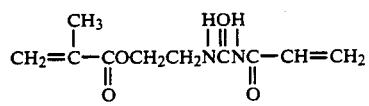
-continued
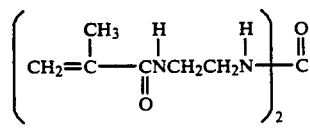
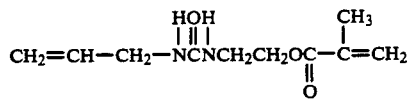
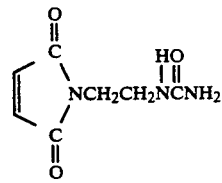
or a mixture thereof.
* * * * *